(12) United States Patent
Tanabe et al.

(10) Patent No.: US 9,334,424 B2
(45) Date of Patent: May 10, 2016

(54) TEMPORARY ADHESIVE FOR WAFER PROCESSING, MEMBER FOR WAFER PROCESSING USING THE SAME, WAFER PROCESSED BODY, AND METHOD FOR PRODUCING THIN WAFER

(71) Applicant: SHIN-ETSU CHEMICAL CO., LTD., Tokyo (JP)

(72) Inventors: Masahito Tanabe, Annaka (JP); Michihiro Sugo, Takasaki (JP); Shohei Tagami, Annaka (JP); Hiroyuki Yasuda, Tomioka (JP); Hideto Kato, Takasaki (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 405 days.

(21) Appl. No.: 13/868,622

(22) Filed: Apr. 23, 2013

(65) Prior Publication Data

US 2013/0302983 A1 Nov. 14, 2013

(30) Foreign Application Priority Data

May 8, 2012 (JP) .................................. 2012-106926

(51) Int. Cl.
| | |
|---|---|
| *B32B 25/20* | (2006.01) |
| *C09J 7/02* | (2006.01) |
| *B32B 7/06* | (2006.01) |
| *B32B 7/12* | (2006.01) |
| *B32B 27/28* | (2006.01) |
| *H01L 21/683* | (2006.01) |

(52) U.S. Cl.
CPC .................. *C09J 7/0228* (2013.01); *B32B 7/06* (2013.01); *B32B 7/12* (2013.01); *B32B 27/283* (2013.01); *C09J 7/0203* (2013.01); *H01L 21/6835* (2013.01); *B32B 2457/14* (2013.01); *C09J 2201/36* (2013.01); *C09J 2203/326* (2013.01); *C09J 2483/00* (2013.01); *H01L 21/6836* (2013.01); *H01L 2221/6834* (2013.01); *H01L 2221/68327* (2013.01); *H01L 2221/68381* (2013.01); *Y10T 428/2839* (2015.01)

(58) Field of Classification Search
CPC ...... C09J 7/0228; B32B 7/06; H01L 21/6836; C08G 77/16; C08G 77/70
See application file for complete search history.

(56) References Cited

U.S. PATENT DOCUMENTS

| | | | |
|---|---|---|---|
| 7,541,264 B2 | 6/2009 | Gardner et al. | |
| 2005/0233547 A1 | 10/2005 | Noda et al. | |
| 2012/0135225 A1* | 5/2012 | Colas | A61K 9/7084 428/332 |

FOREIGN PATENT DOCUMENTS

| | | |
|---|---|---|
| JP | A-2004-064040 | 2/2004 |
| JP | A-2006-328104 | 12/2006 |
| WO | 2011 022199 | * 2/2011 |

* cited by examiner

*Primary Examiner* — Kuo-Liang Peng
(74) *Attorney, Agent, or Firm* — Oliff PLC

(57) ABSTRACT

The present invention provided is the temporary adhesive for wafer processing which temporarily bonds a wafer having a circuit face on the front surface and a processing face on the back surface to a support, and includes a first temporary adhesive layer which is a layer (A) of a thermoplastic resin modified organopolysiloxane obtained by partial dehydration condensation of an organopolysiloxane resin containing a $R^{21}R^{22}R^{23}SiO_{1/2}$, and a $SiO_{4/2}$ unit in a molar ratio of $R^{21}R^{22}R^{23}SiO_{1/2}$ unit/$SiO_{4/2}$ unit of 0.6 to 1.7 and an organopolysiloxane represented by the following general formula (1), and a second temporary adhesive layer which is a thermosetting modified siloxane polymer layer (B) which is laminated on the first temporary adhesive layer and is releasably bonded to the support.

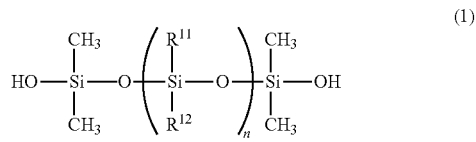

(1)

20 Claims, 1 Drawing Sheet

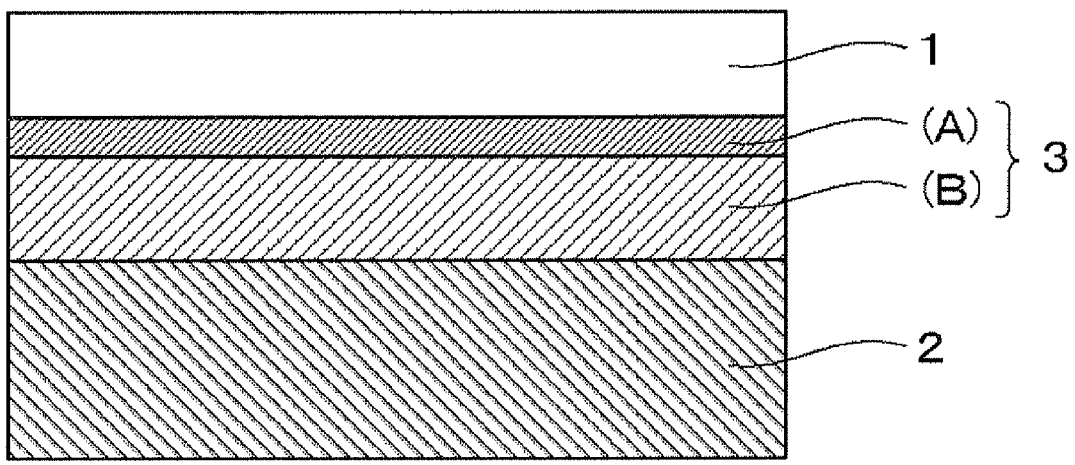

TEMPORARY ADHESIVE FOR WAFER PROCESSING, MEMBER FOR WAFER PROCESSING USING THE SAME, WAFER PROCESSED BODY, AND METHOD FOR PRODUCING THIN WAFER

BACKGROUND OF THE INVENTION

1. Field of the Invention

The present invention relates to a temporary adhesive for wafer processing, a member for wafer processing using the same, a wafer processed body, and a method for producing a thin wafer.

2. Description of the Related Art

Three-dimensional semiconductor mounting has become an essential process for achieving higher densities and higher capacities. The three-dimensional mounting technique is a semiconductor fabrication technique in which single semiconductor chips are reduced in thickness, and a plurality of layers of these chips are then stacked together with through-silicon vias (TSV) used for electrical connections between the layers. In order to realize this type of structure, a substrate having a semiconductor circuit must be subjected to grinding of the non-circuit-forming face (also referred to as the "back surface") to reduce the thickness of the substrate, and electrodes including TSVs must then be formed on the back surface. Heretofore, during the back surface grinding of the silicon substrate, a back surface-protective tape is bonded to the opposite side of the substrate to the grinding surface. Thus, wafer breakage is prevented during grinding. However, an organic resin film is used in this tape as the base material. Therefore, the tape has good flexibility, but inadequate strength and heat resistance. The tape is not suited to a TSV formation process and back surface-wiring layer formation process.

Accordingly, a system has been proposed in which the semiconductor substrate is bonded to a support of silicon, glass, or the like, with an adhesive, to achieve a structure that is able to sufficiently withstand the back surface grinding and TSV and back surface electrode formation processes. In this system, an adhesive layer used when bonding the substrate to the support is important. The adhesive must be capable of bonding the substrate to the support with no voids therebetween, have sufficient durability to withstand the subsequent processes, and finally allow the thin wafer to be easily separated from the support. Since this separation is performed in the final process, the adhesive layer is referred to as temporary adhesive layer herein.

As conventionally known temporary adhesive layers and separation methods, techniques have been proposed. One is a technique in which an adhesive containing a light-absorbing substance is irradiated with high-intensity light to decompose an adhesive layer and separate the adhesive layer from a support (Patent Document 1), and the other is a technique in which a heat-meltable hydrocarbon-based compound is used as the adhesive, and bonding and separation are performed with the adhesive in a heated and melted state (Patent Document 2). The former technique requires an expensive apparatus such as a laser, and also suffers from the problem that the processing time per substrate is long. The latter technique is simple since it is controlled only by heating. However, the heat stability at high temperature higher than 200° C. is insufficient. Therefore, the applicable range is narrow. Further, the temporary adhesive layers are not applied to formation of uniform film on a substrate having a high step and complete adhesion to a support.

Further, a technique in which a silicone pressure sensitive adhesive is used for a temporary adhesive layer has been proposed (Patent Document 3). In this technique, a substrate is bonded to a support with an addition-curable silicone pressure sensitive adhesive, and at the time of separation, the bonded substrate is immersed in a chemical agent that dissolves or decomposes a silicone resin and the substrate is detached from the support. This technique requires an extremely extended time for separation, so that application of the technique to an actual production process is difficult.

Since the temporary adhesives are brought to be unnecessary after separation, they are required to be cleaned and removed by an organic solvent, and the adhesives have to be easily dissolved in a cleaning organic solvent. However, the temporary adhesive which is easily dissolved in an organic solvent has a low adhesion force. This may cause problems such as occurrence of a void and separation from a support in a step of processing a substrate. On the other hand, a temporary adhesive having a high adhesion force is unlikely to be separated from a support. In addition, a temporary adhesive layer after the separation is unlikely to be cleaned. Thus, the temporary adhesive has problems such as control of separation force and cleaning property.

PRIOR ART DOCUMENTS PATENT DOCUMENTS

Patent Document 1: Japanese Patent Laid-Open Publication No. 2004-64040

Patent Document 2: Japanese Patent Laid-Open Publication No, 2006-328104

Patent Document 3: U.S. Pat. No. 7,541,264

SUMMARY OF THE INVENTION

In view of the circumstances, an object of the present invention is to provide a wafer processed body which has an appropriate separation force with the cleaning property after separation maintained, a member for wafer processing, a temporary adhesive for wafer processing, and a method for producing a thin wafer using the same.

The present invention is made to solve the above-described problems. The present invention provides a temporary adhesive for wafer processing which temporarily bonds a wafer having a circuit face on the front surface and a processing face on the back surface to a support. The temporary adhesive for wafer processing includes a first temporary adhesive layer which is a layer (A) of a thermoplastic resin modified organopolysiloxane obtained by partial dehydration condensation of an organopolysiloxane resin containing a $R^{21}R^{22}R^{23}SiO_{1/2}$, wherein $R^{21}$, $R^{22}$, and $R^{23}$ represent each a substituted or an unsubstituted monovalent hydrocarbon group having 1 to 10 carbon atoms or a hydroxyl group, and a $SiO_{4/2}$ unit in a molar ratio of $R^{21}R^{22}R^{23}SiO_{1/2}$ unit/$SiO_{4/2}$ unit of 0.6 to 1.7 and an organopolysiloxane represented by the following general formula (1), and a second temporary adhesive layer which is a thermosetting modified siloxane polymer layer (B) which is laminated on the first temporary adhesive layer and is releasably bonded to the support,

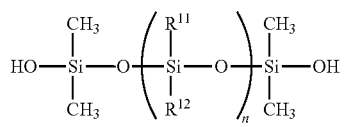

(1)

wherein $R^{11}$ and $R^{12}$ represent each a substituted or an unsubstituted monovalent hydrocarbon group having 1 to 10 carbon atoms and "n" represents 5,000 to 10,000.

In such a temporary adhesive for wafer processing, a partial condensate of the organopolysiloxane and organopolysiloxane resin can be used as a release layer to control a separation force between a wafer and a support. A temporary adhesive of two layers including a thermoplastic temporary adhesive layer (A) of a resin modified organopolysiloxane and a thermosetting temporary adhesive layer (B) mainly containing a modified siloxane polymer can be used for bonding between a wafer and a support. The temporary adhesive can be used to easily produce a thin wafer having a through electrode structure or a bump connection structure. When the temporary adhesive for wafer processing of the present invention is used, a separation force between a wafer and a support can be controlled with the cleaning property after separation maintained, and a thin wafer can be easily produced. In addition, after the production of the thin wafer, the wafer can be easily separated from the support at room temperature. Therefore, a brittle thin wafer can be easily handled.

In this case, the ratio of the organopolysiloxane to the organopolysiloxane resin, which are dehydrated and condensed, in the thermoplastic resin modified organopolysiloxane layer (A) is preferably 99:1 to 50:50. The weight average molecular weight of the thermoplastic resin modified organopolysiloxane is preferably 400,000 to 1,500,000.

Such a temporary adhesive for wafer processing facilitates the control of a separation force between a wafer and a support with the cleaning property maintained. Further, a thin wafer can be easily produced. After the production of the thin wafer, the wafer can be easily separated from the support at room temperature.

The thermosetting modified siloxane polymer layer (B) is preferably a thermosetting layer of a composition containing 0.1 to 50 parts by mass of any one or more kinds selected from an amino condensate modified by formalin or formalin alcohol, a melamine resin, a urea resin, a phenol compound having two or more methylol groups or alkoxymethylol groups on the average per molecule, and an epoxy compound having two or more epoxy groups on the average per molecule, as a crosslinker, relative to 100 parts by mass of thermosetting modified siloxane polymer including a silphenylene-containing polymer having a repeating unit represented by the following general formula (2) and a weight average molecular weight of 3,000 to 500,000 or an epoxy group-containing silicone polymer having a repeating unit represented by the following general formula (4) and a weight average molecular weight of 3,000 to 500,000,

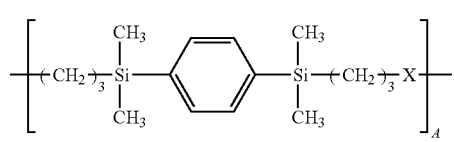

(2)

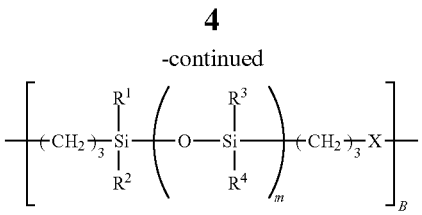

wherein $R^1$ to $R^4$ represent each a monovalent hydrocarbon group having 1 to 8 carbon atoms and may be the same or different; m is an integer of 1 or 100; A represents a positive number; B represents 0 or a positive number; and X represents a divalent organic group represented by the following general formula (3),

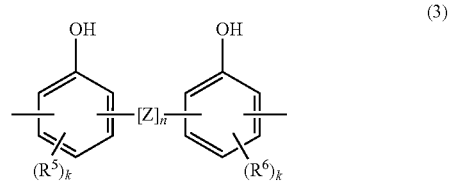

(3)

wherein Z represents a divalent organic group selected from

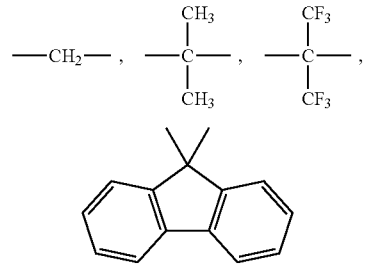

"n" represents 0 or 1; $R^5$ and $R^6$ represent each an alkyl group or an alkoxy group having 1 to 4 carbon atoms and may be the same or different from each other; and "k" represents 0, 1, or 2,

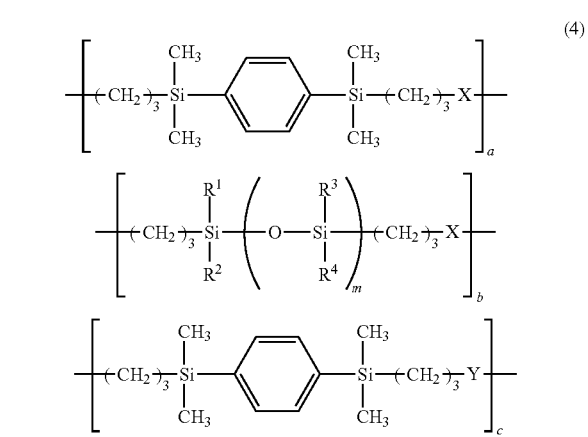

(4)

-continued

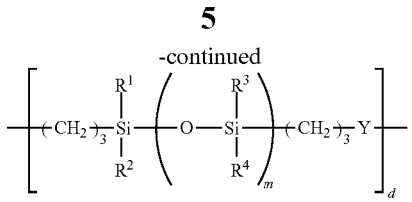

wherein $R^1$ to $R^4$ represent each a monovalent hydrocarbon group having 1 to 8 carbon atoms and may be the same or different; "m" represents an integer of 1 or 100; "a", "b", "c", and "d" represent each 0 or a positive number, provided that "c" and "d" are not 0 simultaneously and they satisfy $0<(c+d)/(a+b+c+d)\leq 1.0$; X represents a divalent organic group represented by the following general formula (3); and Y represents a divalent organic group represented by the following general formula (5),

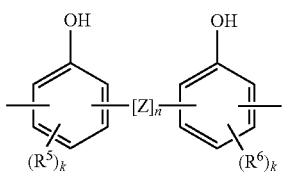    (3)

wherein Z represents a divalent organic group selected from

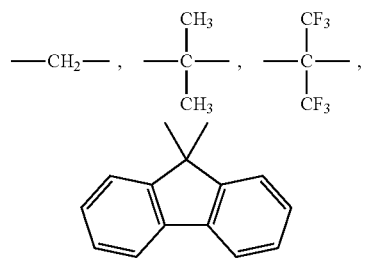

"n" represents 0 or 1; $R^5$ and $R^6$ represent each an alkyl group or an alkoxy group having 1 to 4 carbon atoms and may be the same or different from each other; and "k" represents 0, 1, or 2,

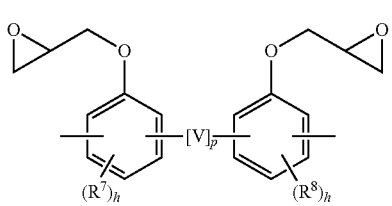    (5)

wherein V represents a divalent organic group selected from

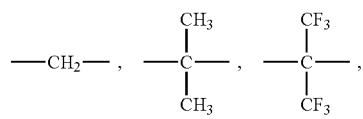

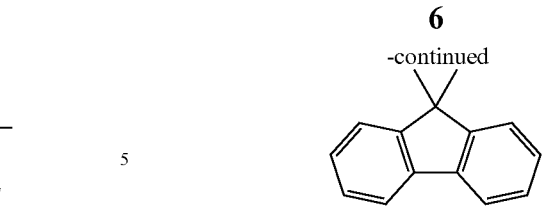

"p" represents 0 or 1; $R^7$ and $R^8$ represent each an alkyl group or an alkoxy group having 1 to 4 carbon atoms and may be the same or different from each other; and "h" represents 0, 1, or 2.

Use of the thermosetting modified siloxane polymer layer (B) can facilitate the control of a separation force between a wafer and a support with the cleaning property maintained. Further, a thin wafer can be easily produced. After the production of the thin wafer, the wafer can be easily separated from the support at room temperature.

The present invention provides a member for wafer processing including the temporary adhesive for wafer processing and a support.

Such a member for wafer processing is useful for more simple production of a thin wafer.

The present invention provides a wafer processed body in which the temporary adhesive for wafer processing is laminated on a support and a wafer having a circuit face on the front surface and a processing face on the back surface is laminated thereon.

Such a wafer processed body can be used to easily produce a thin wafer. In addition, after the production of the thin wafer, the wafer can be easily separated from the support at room temperature. Therefore, a brittle thin wafer can be easily handled.

Further, the present invention provides a method for producing a thin wafer including (a) bonding a circuit-forming face of a wafer having the circuit-forming face on the front surface and a non-circuit-forming face on the back surface to a support with the temporary adhesive for wafer processing, (b) grinding or polishing the non-circuit-forming face of the wafer bonded to the support, (c) processing the non-circuit-forming face of the wafer, and (d) separating the processed wafer from the support.

According to the method for producing a thin wafer, the non-circuit-forming face of a wafer bonded to a support is ground or polished, and then this wafer can be easily separated from the support. Therefore, a thin wafer can be easily produced.

In this case, it is preferable that (e) removing a temporary adhesive layer remaining on the circuit-forming face of the separated wafer follow (d) separating the processed wafer from the support.

Through the step (e), the temporary adhesive layer remaining on the circuit-forming face of the wafer can be completely removed.

EFFECTS OF INVENTION

The temporary adhesive for wafer processing of the present invention is a temporary adhesive of two layers including a thermoplastic temporary adhesive layer of a resin modified organopolysiloxane as a release layer and a thermosetting temporary adhesive layer mainly containing a modified siloxane polymer as a hardened layer. Therefore, a separation force against a support can be controlled with the cleaning property after separation maintained, and a thin wafer can be easily produced. In addition, after the production of the thin wafer, the wafer can be easily separated from the support at room temperature. Accordingly, a brittle thin wafer can be easily handled.

DESCRIPTION OF THE DRAWINGS

FIG. 1 is a cross-sectional view showing one example of a wafer processed body of the present invention.

DETAILED DESCRIPTION OF THE PREFERRED EMBODIMENTS

A temporary adhesive is required to have a strong adhesion force for production of a thin wafer. However, a temporary adhesive having a strong adhesion force is unlikely to be separated from a support. In addition, a temporary adhesive layer after the separation is unlikely to be cleaned. The present inventors have intensively studied, and as a result found that the temporary adhesive for wafer processing of the present invention has separation force from a support with an adhesion force, and cleaning force after the separation. Thus, the present invention has been completed.

Hereinafter, a temporary adhesive for wafer processing containing a resin modified organopolysiloxane, a member for wafer processing, a wafer processed body, and a method for producing a thin wafer will be described in detail. However, the present invention is not limited to these.

The present invention provides a temporary adhesive for wafer processing which temporarily bonds a wafer having a circuit face on the front surface and a processing face on the back surface to a support. The temporary adhesive for wafer processing includes a first temporary adhesive layer which is a layer (A) of a thermoplastic resin modified organopolysiloxane obtained by partial dehydration condensation of an organopolysiloxane resin containing a $R^{21}R^{22}R^{23}SiO_{1/2}$, wherein $R^{21}$, $R^{22}$, and $R^{23}$ represent each a substituted or an unsubstituted monovalent hydrocarbon group having 1 to 10 carbon atoms or a hydroxyl group, and a $SiO_{4/2}$ unit in a molar ratio of $R^{21}R^{22}R^{23}SiO_{4/2}$ unit/$SiO_{4/2}$ unit of 0.6 to 1.7 and an organopolysiloxane represented by the following general formula (1), and a second temporary adhesive layer which is a thermosetting modified siloxane polymer layer (B) which is laminated on the first temporary adhesive layer and is releasably bonded to the support,

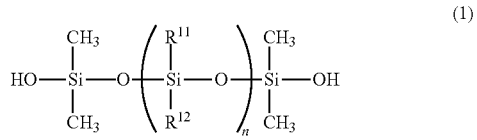

(1)

wherein $R^{11}$ and $R^{12}$ represent each a substituted or an unsubstituted monovalent hydrocarbon group having 1 to 10 carbon atoms and "n" represents 5,000 to 10,000.

As shown in FIG. 1, a temporary adhesive for wafer processing 3 of the present invention is a laminate of the thermoplastic resin modified organopolysiloxane polymer layer (A) (first temporary adhesive layer) and the thermosetting modified siloxane polymer layer (B) (second temporary adhesive layer). A member for wafer processing of the present invention has a support 2, a thermosetting modified siloxane polymer (B) (second temporary adhesive layer) laminated thereon, and a thermoplastic resin modified organopolysiloxane polymer layer (A) (first temporary adhesive layer) laminated thereon.

A wafer processed body of the present invention has a wafer 1 to be processed, a support 2 supporting the wafer 1 during processing of the wafer 1, and a temporary adhesive material layer 3 which is disposed between the wafer 1 and the support 2. The temporary adhesive layer 3 includes a thermoplastic resin modified organopolysiloxane polymer layer (A) (first temporary adhesive layer) and a thermosetting modified siloxane polymer layer (B) (second temporary adhesive layer). The first temporary adhesive layer is releasably bonded to the front surface of the wafer having a circuit face on the front surface and a processing face on the back surface, and the second temporary adhesive layer is releasably bonded to the support.

[First Temporary Adhesive Layer/Thermoplastic Resin Modified Organopolysiloxane Polymer Layer (A)]

A partial condensate of an organopolysiloxane resin containing a $R^{21}R^{22}R^{23}SiO_{1/2}$ unit and an $SiO_{4/2}$ unit in a molar ratio of $R^{21}R^{22}R^{23}SiO_{1/2}$ unit/$SiO_{4/2}$ unit of 0.6 to 1.7 and an organopolysiloxane which has both terminals blocked with hydroxyl groups and a polymerization degree of 5,000 to 10,000 and is represented by the general formula (1) is used as a first temporary adhesive layer/thermoplastic resin modified organopolysiloxane polymer layer (A). The layer (A) acts as a release layer, and therefore a separation force between a wafer and a support can be controlled. Since the polymerization degree of organopolysiloxane is 5,000 to 10,000, the layer (A) is a thermoplastic high polymerization resin modified organopolysiloxane polymer layer.

$R^{11}$ and $R^{12}$ described above are each a substituted or an unsubstituted monovalent hydrocarbon group having 1 to 10 carbon atoms. Specific examples thereof include a monovalent hydrocarbon group including an alkyl group such as a methyl group, an ethyl group, a n-propyl group, an isopropyl group, a n-butyl group, a tert-butyl group, a n-pentyl group, a cyclopentyl group, and a n-hexyl group, a cycloalkyl group such as a cyclohexyl group, an aryl group such as a phenyl group and a tolyl group, and a monovalent hydrocarbon group in which some or all of the hydrogen atoms are replaced by halogen atoms. A methyl group and a phenyl group are preferable.

$R^{21}$, $R^{22}$, and $R^{23}$ are each a substituted or an unsubstituted monovalent hydrocarbon group having 1 to 10 carbon atoms or a hydroxyl group. Specific examples thereof include a monovalent hydrocarbon group including an alkyl group such as a methyl group, an ethyl group, a n-propyl group, an isopropyl group, a n-butyl group, a tert-butyl group, a n-pentyl group, a cyclopentyl group, and a n-hexyl group, a cycloalkyl group such as a cyclohexyl group, an aryl group such as a phenyl group and a tolyl group, a monovalent hydrocarbon group in which some or all of the hydrogen atoms are replaced by halogen atoms, and a hydroxyl group. A methyl group is preferable.

The organopolysiloxane containing a $R^{21}R^{22}R^{23}SiO_{1/2}$ unit (M unit) and a $SiO_{4/2}$ unit (Q unit) (hereinafter sometimes referred to as MQ resin) may have a hydroxyl group bonded to a silicon atom. The content of hydroxyl group relative to 100 g of MQ resin is about 0 to 4.0% by mass, preferably 0.5 to 1.5% by mass. Further, the MQ resin may contain relatively small amounts of $R^{24}SiO_{3/2}$ unit (T unit) and $R^{25}R^{26}SiO_{2/2}$ unit (D unit), wherein $R^{24}$, $R^{25}$, and $R^{26}$ are as defined in $R^{21}$, $R^{22}$, and $R^{23}$.

In this case, the ratio of the organopolysiloxane to the organopolysiloxane resin, which are dehydrated and condensed, in the thermoplastic resin modified organopolysiloxane layer (A) is preferably 99:1 to 50:50.

Examples of an organic solvent used in a dehydration condensation reaction include pentane, hexane, cyclopentane, cyclohexane, methylcyclohexane, octane, isooctane, decane, undecane, isododecane, limonene, and pinene. Toluene is preferable. Examples of an amine-based catalyst to be used include ammonia water, triethylamine, and pyridine. Ammonia water is preferably used. The reaction time is 12 to 100 hours, preferably 18 to 36 hours.

Organopolysiloxane produced by the reaction is dissolved in a solvent such as toluene, hexamethyldisilanzane is added in an amount of 5 to 20 parts by mass relative to 100 parts by mass of organopolysiloxane, and the mixture is refluxed for 3 to 5 hours. Thus, a remaining hydroxyl group may be converted to a trimethylsiloxy group.

Further, the obtained resin modified organopolysiloxane is dissolved in a rich solvent such as hexane, and a poor solvent such as acetone is mixed in an amount 1.5 to 3 times the total amount of the mixture to precipitate a resin modified organopolysiloxane in a lower layer. The resin modified organopolysiloxane may be used.

The molecular weight of the obtained resin modified organopolysiloxane is a weight average molecular weight value obtained by gel permeation chromatography (GPC) in accordance with a calibration curve produced using standard polystyrene (in the specification, this molecular weight is referred to as the "weight-average molecular weight"). The weight average molecular weight is preferable 400,000 or more, more preferably 550,000 or more, and preferably 1,500,000 or less, more preferably 1,200,000 or less.

When the weight average molecular weight of the obtained resin modified organopolysiloxane is 400,000 or more, a grinding step of reducing the thickness of a wafer can be sufficiently withstood, and therefore it is preferable. On the other hand, when the weight average molecular weight is 1,500,000 or less, there is no fear that cleaning cannot be performed in a cleaning step after completion of the processing step, and therefore it is preferable.

Further, it is preferable that the content of a low-molecular component having a molecular weight of 740 or less be 0.5% by mass or less since the heat resistance to a thermal treatment in formation of a through electrode and a thermal treatment of a bump electrode formed on the back surface of a wafer is sufficient.

It is preferable that the content of D unit in a resin is 95.000 to 99.999% by mole. When the content is 95.000% by mole or more, the grinding step of reducing the thickness of a wafer can be withstood, and therefore it is preferable. When it is 99.999% by mole or less, there is no fear that a temporary adhesive layer (B) cannot be separated after completion of the processing step, and therefore it is preferable.

Organopolysiloxane and organopolysiloxane resin before a reaction may be each used alone or in combination of two or more kinds thereof. Further, a single or two or more kinds of resin modified organopolysiloxane may be obtained.

The thermoplastic organopolysiloxane layer made into a film in advance may be bonded to a wafer using a roll laminator or the like. Alternatively, a solution of the thermoplastic organopolysiloxane may be applied to a wafer by a method such as a spin coating method or a roll coater method. When the layer (A) is formed on a wafer by a method such as a spin coating method, it is preferable that a resin be used as a solution to coat a wafer. In this case, a hydrocarbon-based solvent such as pentane, hexane, cyclohexane, decane, isododecane, or limonene is suitably used. The layer (A) is preferably formed so that the thickness is 0.1 to 10 μm. When the thickness is 0.1 μm or more, the step on a device wafer can be solved. When it is 10 μm or less, the grinding step of reducing the thickness of a wafer can be withstood, and therefore it is preferable.

[Second Temporary Adhesive Layer/Thermosetting Modified Siloxane Polymer Layer (B)]

A second temporary adhesive layer/thermosetting modified siloxane polymer layer (B) is a second temporary adhesive layer including a thermosetting modified siloxane polymer layer (B) which is laminated on the first temporary adhesive layer and is releasably bonded to a support. Examples of the second temporary adhesive layer (B) include a layer of a hardened material of a thermosetting composition mainly containing a thermosetting modified siloxane polymer represented by a general formula (2) or (4).

Polymer Represented by General Formula (2):

It is a silphenylene-containing polymer having a repeating unit represented by the following general formula (2) and a weight average molecular weight of 3,000 to 500,000,

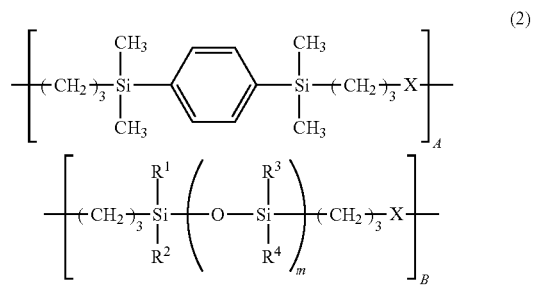

wherein $R^1$ to $R^4$ represent each a monovalent hydrocarbon group having 1 to 8 carbon atoms such as an alkyl group and may be the same or different from each other; "m" represents an integer of 1 or 100; A represents a positive number; B represents 0 or a positive number; and X represents a divalent organic group represented by the following general formula (3),

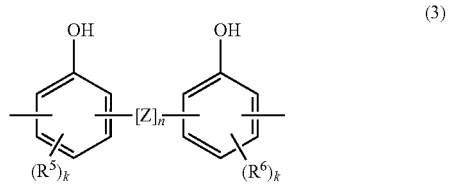

wherein Z represents a divalent organic group selected from

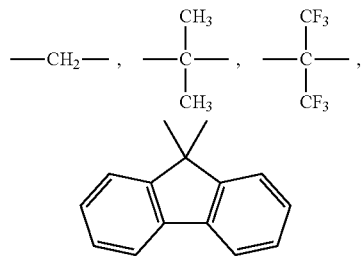

"n" represents 0 or 1; $R^5$ and $R^6$ represent each an alkyl group or an alkoxy group having 1 to 4 carbon atoms and may be the same or different from each other; and "k" represents 0, 1, or 2.

In this case, specific examples of $R^1$ to $R^4$ include a methyl group, an ethyl group, and a phenyl group. "m" represents preferably an integer of 3 to 60, more preferably 8 to 40. Further, B/A is 0 to 20, particularly 0.5 to 5.

Polymer Represented by General Formula (4):

It is an epoxy group-containing silicone polymer having a repeating unit represented by the following general formula (4) and a weight average molecular weight of 3,000 to 500,000,

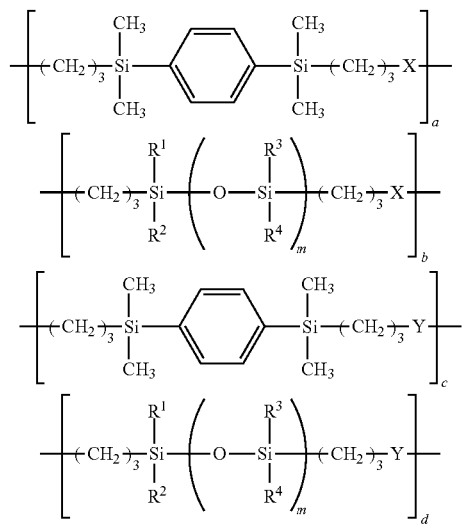

wherein $R^1$ to $R^4$ represent each a monovalent hydrocarbon group having 1 to 8 carbon atoms such as an alkyl group and may be the same or different from each other; "m" represents an integer of 1 or 100; "a", "b", "c", and "d" represent each 0 or a positive number, provided that "c" and "d" are not 0 simultaneously and they satisfy $0<(c+d)/(a+b+c+d)\le 1.0$, preferably $0.1\le (c+d)/(a+b+c+d)\le 0.8$; X represents a divalent organic group represented by the following general formula (3); and Y represents a divalent organic group represented by the following general formula (5),

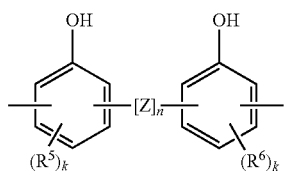

wherein Z represents a divalent organic group selected from

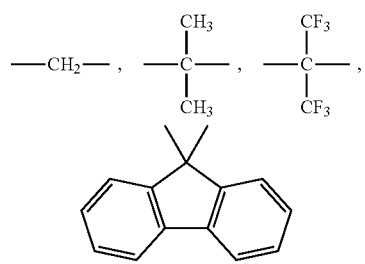

"n" represents 0 or 1; $R^5$ and $R^6$ represent each an alkyl group or an alkoxy group having 1 to 4 carbon atoms and may be the same or different from each other; and "k" represents 0, 1, or 2,

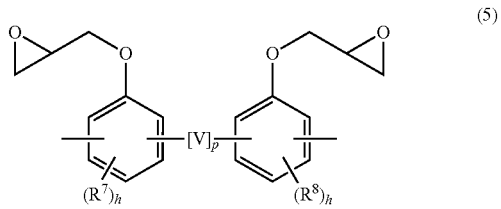

wherein V represents a divalent organic group selected from

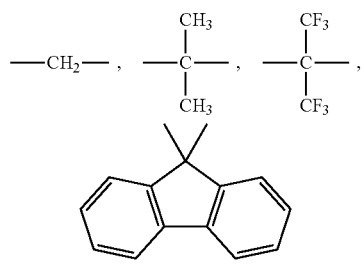

"p" represents 0 or 1; $R^7$ and $R^8$ represent each an alkyl group or an alkoxy group having 1 to 4 carbon atoms and may be the same or different from each other; and "h" represents 0, 1, or 2.

In this case, $R^1$ to $R^4$ and m are as defined above.

The thermosetting composition mainly containing a thermosetting modified siloxane polymer represented by the general formula (2) or (4) contains any one or more crosslinkers selected from an amino condensate modified by formalin or formalin alcohol, a melamine resin, a urea resin, a phenol compound having two or more methylol groups or alkoxymethylol groups on the average per molecule, and an epoxy compound having two or more epoxy groups on the average per molecule since they have thermosetting properties.

In particular, the thermosetting composition may contain a di-, tri-, tetra-, or higher polyfunctional crosslinker, particularly an epoxy resin, for example, EOCN-1020, EOCN-102S, XD-1000, NC-2000-L, EPPN-201, GAN, and NC6000, which are manufactured by NIPPON KAYAKU Co., Ltd., and a crosslinker represented by the following general formula.

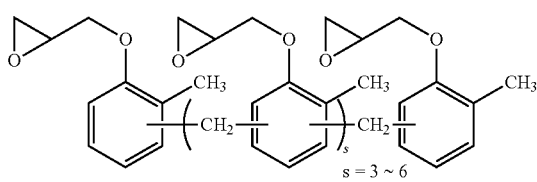

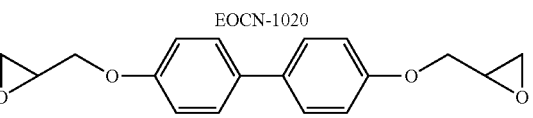

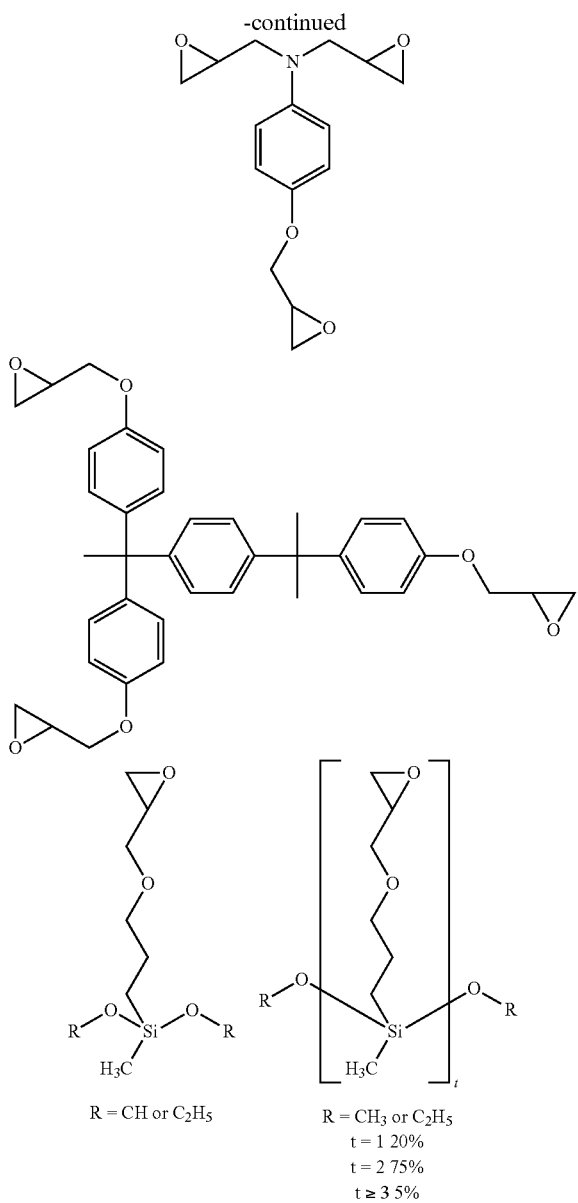

R = CH or C₂H₅

R = CH₃ or C₂H₅
t = 1 20%
t = 2 75%
t ≥ 3 5%

The amount of a crosslinker to be added is 0.1 to 50 parts by mass, preferably 0.1 to 30 parts by mass, more preferably 1 to 20 parts by mass, relative to 100 parts by mass of the thermosetting modified siloxane polymer. A mixture of two or three or more crosslinkers may be added.

The composition may contain 5 parts by mass or less of curing catalyst such as an acid anhydride.

The composition may be formed on the layer (A) which is a film and is laminated on a wafer, or on a support side to manufacture a thin wafer. Alternatively, a solution in which the composition is dissolved may be applied to the layer (A) or a support, specifically, by a method such as a spin coating method, a roll coater method, or a die coater method. In this case, examples of the solution include ketones such as cyclohexanone, cyclopentanone, and methyl 2-n-amyl ketone; alcohols such as 3-methoxy buthanol, 3-methyl-3-methoxy buthanol, 1-methoxy-2-propanol, and 1-ethoxy-2-propanol; ethers such as propylene gylcol monomethyl ether, ethylene gylcol monomethyl ether, propylene gylcol monoethyl ether, ethylene gylcol monoethyl ether, propylenegylcol dimethyl ether, and diethyleneglycol dimethyl ether; and esters such as propylenegylcol monomethyl ether acetate, propylenegylcol monoethyl ether acetate, ethyl lactate, ethyl pyruvate, butyl acetate, methyl 3-methoxypropionate, ethyl 3-ethoxypropionate, tert-butyl acetate, tert-butyl propionate, propylenegylcol mono-tert-butyl ether acetate, and γ-butyrolactone. These solutions may be used alone or in combination of two or more thereof.

Further, in order to further enhance the heat resistance of the composition, a known antioxidant or a filler such as silica may also be added in an amount of 50 parts by mass or less.

The thickness of the temporary adhesive layer (B) after hardening is preferably 10 to 200 μm, more preferably 20 to 120 μm. When the thickness is 10 μm or more, a grinding step of reducing the thickness of a wafer can be sufficiently withstood. When it is 200 μm or less, there is no fear that a resin is deformed in a heat treatment step such as TSV formation step, and it can be applied to practical use. Therefore, it is preferable.

The separation force when the temporary adhesive layer (B) is separated from a support by 180° is preferably 0.5 to 50 gf, more preferably 1 to 40 gf. When the separation force is 0.5 gf or more, a grinding step of reducing the thickness of a wafer can be sufficiently withstood. When it is 50 gf or less, there is no fear that the temporary adhesive layer (B) is unlikely to be separated from a support after production of a thin wafer, and therefore it is preferable.

<Method of Producing Thin Wafer>

A method for producing a thin wafer according to the present invention is characterized that a temporary adhesive for wafer processing including the layers (A) and (B) as an adhesive layer between a wafer having a semiconductor circuit and a support is used. The thickness of a thin wafer obtained by the production method of the present invention is typically 5 to 300 μm, more typically 10 to 100 μm.

The method for producing a thin wafer according to the present invention includes steps (a) to (e).

[Step (a)]

The step (a) is a step of bonding the circuit-forming face of a wafer having a circuit-forming face on a front surface and a non-circuit-forming face on a back surface to a support with an adhesive composed of two layers (A) and (B) described above. The wafer having a circuit-forming face and a non-circuit-forming face is a wafer in which one surface is a circuit-forming face and the other surface is a non-circuit-forming face. A wafer to which the present invention is applied is typically a semiconductor wafer. Examples of the semiconductor wafer include not only a silicon wafer but also a germanium wafer, a gallium-arsenic wafer, a gallium-phosphorus wafer, and a gallium-arsenic-aluminum wafer. The thickness of the wafer is not particularly limited, and is typically 600 to 800 μm, more typically 625 to 775 μm.

As a support, a substrate made of a silicon wafer, a glass wafer, or a quartz wafer can be used. In the present invention, a radiant energy beam need not be irradiated to a temporary adhesive layer through the support, so that the support is not required to exhibit a light transmissive property.

Film-shaped temporary adhesive layers (A) and (B) can be each formed on a wafer and a support. Alternatively, each solution for formation of temporary adhesive layers (A) and (B) can be applied to a wafer and a support by a method such as a spin coating method, to form the temporary adhesive layers (A) and (B). In this case, the layers are each pre-baked in advance at 80 to 200° C. after spin coating according to the volatilization conditions of the solvents. After then, the layers are used.

Further, the films can be attached to each other in advance and bonded so that the film (A) is on a wafer side and the film (B) is on a support side.

The layers (A) and (B) formed on a wafer and a support can be formed as a substrate to be bonded through the layers (A) and (B). The temperature region at this time is preferably 40 to 230° C., more preferably 40 to 200° C. At a temperature within the temperature region, the substrate is pressure-bonded uniformly under reduced pressure to form a wafer processed body (laminate substrate) in which a wafer is bonded to a support.

Examples of a wafer bonding apparatus include commercially available apparatus, for example, EVG520IS and 850TB manufactured by EV Group and XBC300 manufactured by SUSS MicroTec KR.

[Step (b)]

The step (b) is a step of grinding or polishing the non-circuit-forming face of the wafer which has been bonded to the support, that is, and grinding or polishing the back surface of the wafer of the wafer processed body obtained by attachment in the step (a), to reduce the thickness of the wafer. The manner for grinding the wafer back surface is not particularly limited, and any known grinding manner such as a surface grinder is adopted. It is preferable to conduct the grinding while the wafer and a grindstone (diamond) is cooled by applying water thereto. Examples of devices for grinding of the wafer back surface include the DAG-810 (trade name) manufactured by DISCO Corporation.

[Step (c)]

The step (c) is a step of processing the non-circuit-forming face of the wafer processed body having a non-circuit-forming face which has been ground or polished, that is, a wafer processed body which has been reduced in thickness by back surface grinding or polishing. This step includes a variety of processes used at the wafer level. Examples of these processes include electrode formation, metal wiring formation, and protective film formation, on the non-circuit-forming face. Specific examples thereof include conventionally known processes such as metal sputtering for forming an electrode, wet etching for etching a sputtered metal layer, pattern forming by coating of a resist as a mask for forming a metal wiring, followed by exposure and development, separation of a resist, dry etching, forming a metal plating, silicon etching for forming TSV, and forming an oxide film on a silicon surface.

[Step (d)]

The step (d) is a step of separating the wafer which has been processed in the step (c) from the support, that is, separating the thin wafer which has been subjected to a variety of processes from the support prior to dicing. Examples of separation methods include a method that includes sliding a wafer and a support in opposite horizontal directions while heating them (preferably at 200 to 250° C.) to separate the wafer from the support, a method that include securing either the wafer or the support of the wafer processed body horizontally and lifting the other off at a predetermined angle from the horizontal direction, and a method that includes bonding a protective film to the ground surface of the wafer and subsequently separating the wafer and the protective film from the support by peeling procedure. These methods can be adopted without particular limitation.

The present invention can be applied to all the separation method. A more applicable method is a method that includes securing either the wafer or the support of the wafer processed body horizontally and lifting the other off at a predetermined angle from the horizontal direction, or a method that includes bonding a protective film on the ground surface of the ground wafer and separating the wafer and the protection film by the peeling procedure. The separation methods are usually conducted at room temperature.

[Step (e)]

The step (e) is a step of removing some residual adhesive layer (A) when the adhesive layer (A) remains on the circuit-forming face of the separated wafer. Some adhesive layer (A) may remain on the circuit-forming face of the wafer separated from the support in the step (d). In this case, the adhesive layer (A) can be removed, for example, by cleaning the wafer.

In the step (e), all cleaning liquids can be used as long as they are used to dissolve a thermoplastic resin modified organopolysiloxane which is a layer (A) in the adhesive layer. Specific examples thereof include pentane, hexane, cyclohexane, decane, isododecane, and limonene. These solvents may be used alone or in combination of two or more kinds. Further, when removal is difficult, a base or an acid may be added to the solvent. Examples of usable bases include amines such as ethanolamine, diethanolamine, triethanolamine, triethylamine, and ammonia, and ammonium salts such as tetramethylammonium hydroxide. Examples of usable acids include organic acids such as acetic acid, oxalic acid, benzenesulfonic acid, and dodecylbenzenesulfonic acid. The amount of the acid or base to be added is 0.01 to 10% by mass, preferably 0.1 to 5% by mass, as a concentration within the cleaning liquid. In order to further improve the removability of the residue, a conventional surfactant may also be added. Examples of a cleaning method include a puddle cleaning method using the liquid described above, a spray cleaning method, and a method that involves immersion in a tank containing the cleaning liquid. The suitable temperature is 10 to 80° C., preferably 15 to 60° C. A thin wafer can be obtained by water or alcohol rising, followed by drying.

EXAMPLES

Hereinafter, Examples and Comparative Examples will be described, and the present invention will be specifically described. However, the present invention is not limited to the following Examples. "Part(s)" and described herein mean part(s) by mass and % by mass, respectively.

Resin Synthesis Example 1

80 parts of dimethyl polysiloxane (in the general formula (1), n was 9,000) which was a raw rubber having both terminals of molecular chain blocked with hydroxyl groups and had a viscosity at 25° C. in 30% toluene solution of 98,000 mPa·s, and 20 parts of methylpolysiloxane resin which had a molar ratio of $(CH_3)SiO_{1/2}$ unit to $SiO_{4/2}$ unit of 0.75 to 1 and had 1.0% by mole hydroxyl group relative to 100 of solid content were taken into a four-necked flask and dissolved in 900 parts of toluene. To the resulting solution, 1 part of 28% ammonia water was added, and the mixture was stirred at room temperature for 24 hours to cause a condensation reaction. The resultant was heated at 180° C. under reduced pressure to remove toluene, condensed water, and ammonia. As a result, a partial condensate which had been solidified was obtained.

900 parts of toluene was added to 100 parts of the resulting partial condensate and dissolved. To the resulting solution, 20 parts of hexamethyldisilazane was added, and the mixture was stirred at 130° C. for 3 hours to block the remaining hydroxyl groups. The resultant was heated at 180° C. under reduced pressure to remove the solvent and the like. As a result, a partially unreactive condensate which had been solidified was obtained.

Further, 900 parts of hexane was added to 100 parts of the partially unreactive condensate and dissolved. The resultant was added to 2,000 parts of acetone. The precipitated resin was collected. Subsequently, hexane and the like were removed in vacuum, to obtain a dimethylpolysiloxane polymer having a weight average of the molecular weight of 950,000 and 0.005% by mass low molecular weight component with a molecular weight of 740 or less.

20 g of the polymer was dissolved in 80 g of isododecane. The resultant was filtered through a 0.2-μm membrane filter to obtain an isododecane solution (A-1) of dimethylpolysiloxane polymer.

Resin Synthesis Example 2

90 parts of dimethyl polysiloxane (in the general formula (1), n was 9,000) which was a raw rubber having both terminals of molecular chain blocked with hydroxyl groups and had a viscosity at 25° C. in 30% toluene solution of 98,000 mPa·s, and 10 parts of methylpolysiloxane resin which had a molar ratio of $(CH_3)SiO_{1/2}$ unit to $SiO_{1/2}$ unit of 0.75 to 1 and had 1.0% by mole hydroxyl group relative to 100 of solid content were taken into a four-necked flask and dissolved in 900 parts of toluene. To the resulting solution, 1 part of 28% ammonia water was added, and the mixture was stirred at room temperature for 24 hours to cause a condensation reaction. The resultant was heated at 180° C. under reduced pressure to remove toluene, condensed water, and ammonia. As a result, a partial condensate which had been solidified was obtained. 900 parts of toluene was added to 100 parts of the partial condensate and dissolved. To the resulting solution, 20 parts of hexamethyldisilazane was added, and the mixture was stirred at 130° C. for 3 hours to block the remaining hydroxyl groups. The resultant was heated at 180° C. under reduced pressure to remove the solvent and the like. As a result, a partially unreactive condensate which had been solidified was obtained. Further, 900 parts of hexane was added to 100 parts of the partially unreactive condensate and dissolved. The resultant was added to 2,000 parts of acetone. The precipitated resin was collected. Subsequently, hexane and the like were removed in vacuum, to obtain a dimethylpolysiloxane polymer having a weight average of the molecular weight of 900,000 and 0.005% by mass low molecular weight component with a molecular weight of 740 or less.

20 g of the polymer was dissolved in 80 g of isododecane. The resultant was filtered through a 0.2-μm membrane filter to obtain an isododecane solution (A-2) of dimethylpolysiloxane polymer.

Resin Synthesis Example 3

95 parts of dimethyl polysiloxane (in the general formula (1), n was 9,000) which was a raw rubber having both terminals of molecular chain blocked with hydroxyl groups and had a viscosity at 25° C. in 30% toluene solution of 98,000 mPa·s, and 5 parts of methylpolysiloxane resin which had a molar ratio of $(CH_3)SiO_{1/2}$ unit to $SiO_{4/2}$ unit of 0.75 to 1 and had 1.0% by mole hydroxyl group relative to 100 of solid content were taken into a four-necked flask and dissolved in 900 parts of toluene. To the resulting solution, 1 part of 28% ammonia water was added, and the mixture was stirred at room temperature for 24 hours to cause a condensation reaction. The resultant was heated at 180° C. under reduced pressure to remove toluene, condensed water, and ammonia. As a result, a partial condensate which had been solidified was obtained. 900 parts of toluene was added to 100 parts of the partial condensate and dissolved. To the resulting solution, 20 parts of hexamethyldisilazane was added, and the mixture was stirred at 130° C. for 3 hours to block the remaining hydroxyl groups. The resultant was heated at 180° C. under reduced pressure to remove the solvent and the like. As a result, a partially unreactive condensate which had been solidified was obtained. Further, 900 parts of hexane was added to 100 parts of the partially unreactive condensate and dissolved. The resultant was added to 2,000 parts of acetone. The precipitated resin was collected. Subsequently, hexane and the like were removed in vacuum, to obtain a dimethylpolysiloxane polymer having a weight average of the molecular weight of 800,000 and 0.005% by mass low molecular weight component with a molecular weight of 740 or less.

20 g of the polymer was dissolved in 80 g of isododecane. The resultant was filtered through a 0.2-μm membrane filter to obtain an isododecane solution (A-3) of dimethylpolysiloxane polymer.

Resin Synthesis Example 4

396.9 g of compound (M-1) and 45.0 g of compound (M-2) were taken into a 5 L flask equipped with a stirrer, a thermometer, a nitrogen purge system, and a reflux condenser and dissolved in 1,875 g of toluene. Further, 949.6 g of compound (M-3) and 6.1 g of compound (M-4) were added, and the mixture was warmed to 60° C. After then, 2.2 g of carbon-supported platinum catalyst (5% by mass) was added. It was confirmed that the internal reaction temperature was increased to 65 to 67° C. The temperature was then increased to 90° C. for 3 hours, and decreased to 60° C. 2.2 g of carbon-supported platinum catalyst (5% by mass) was added, and 107.3 g of compound (M-5) was added dropwise to the flask over 1 hour. The temperature in the flask was increased to 78° C. After completion of dropwise addition, the mixture was aged at 90° C. for 3 hours, and then cooled to room temperature. 1,700 g of methyl isobutyl ketone (MIBK) was added. The reaction solution was filtered under pressure through a filter to remove the platinum catalyst. 760 g of pure water was added to the resulting polymer solution, and the mixture was stirred, allowed to stand, and separated. The aqueous layer of lower layer was removed. The separation and water-washing operation was repeated six times to remove a slight amount of acid component in the polymer solution. The solvent in the resin solution was distilled under reduced pressure and 950 g of cyclopentanone was added to obtain a resin solution containing cyclopentanone having a solid content concentration of 60% by mass as a solvent. The molecular weight of resin in the resin solution was measured by GPC. The weight average molecular weight was 62,000 in terms of polystyrene, and (c+d)/(a+b+c+d) in the formula (2) was 0.10. 15 g of epoxy of cresol novolac (available from NIPPON KAYAKU Co., Ltd., EOCN1020-55) and 0.2 g of tetrahydro phthalic anhydride (New Japan Chemical Co., Ltd., RIKACID HH-A) were added to 100 g of resin solution and the mixture was filtered through a 0.2 μm membrane filter to obtain a resin solution (B-1).

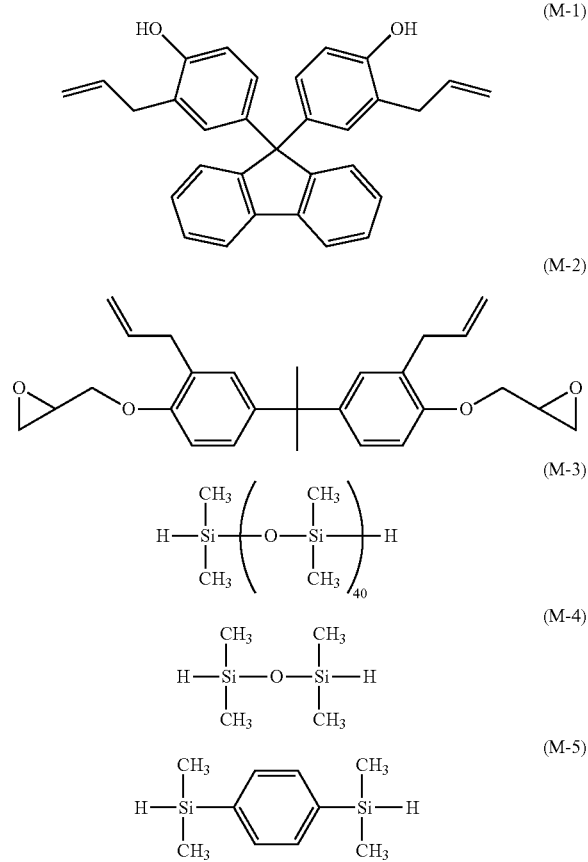

Examples 1 to 3 and Comparative Examples 1 and 2

Each of compounds (A-1), (A-2), and (A-3) was applied to a silicon wafer (thickness: 725 μm) with a diameter of 200 mm in which copper posts with a high 10 μm and a diameter of 40 μm were formed on the entire surface by a spin coating method to form a film with a thickness shown in Table 1 on a bump forming surface of the wafer. On the other hand, a compound (B-1) was applied to a glass plate with a diameter of 200 mm (thickness: 500 μm) as a support by the spin coating method to form a film with a thickness shown in Table 1. At this time, the wafer and the glass were each coated with a resin and then heated at 120° C. for 2 minutes on a hot plate. The silicon wafer and glass plate which each had the resin layer were bonded to each other in a vacuum attachment device under the following conditions so that the resin sides are in contact (compression bonding condition). A silicon wafer without a resin layer (B) and a glass plate were used in Comparative Example 1, and A silicon wafer without a resin layer (A) and a glass plate were used in Comparative Example 2.

After then, the following tests were conducted. The results are shown in Table 1.

—Adhesion Test—

The bonding of wafers with a diameter of 200 mm was conducted by a wafer bonding device 520IS manufactured by EV Group. Each bonding was conducted at a bonding temperature listed in Table 1, a pressure of $10^{-3}$ mbar or lower within a chamber upon bonding, and a load of 5 kN. After the bonding, the substrate was heated in an oven at 180° C. for 1 hour to harden the layer (B). A wafer processed body having a temporary adhesive for wafer processing was manufactured. After then, the adhered state of each interface after cooled down to room temperature was confirmed by visual inspection. A case where abnormalities such as air bubbles were not caused at the interface is evaluated as good, whereas a case where abnormalities were caused is evaluated as poor.

—Back Surface Grinding Durability Test—

Grinding of the back surface of the silicon wafer was conducted by a grinder (manufactured by DISCO Corporation, DAG810) using a diamond whetstone. The substrate was ground up to a final substrate thickness of 50 μm, followed by checking of presence or absence of abnormalities such as crack and separation by an optical microscope (×100). A case where no anomalies have occurred is evaluated as good, whereas a case where anomalies have been detected is evaluated as poor.

—Heat Resistance Test—

A wafer processed body in which the silicon wafer had been subjected to back surface grinding was placed in an oven at 250° C. under a nitrogen atmosphere for 2 hours, was then heated on a hot plate at 270° C. for 10 minutes, and was inspected for the presence or absence of external appearance anomalies. A case where no external appearance anomalies have occurred is evaluated as good, whereas a case where external appearance anomalies have been detected is evaluated as poor.

—Separation Property Test—

A dicing tape was bonded on a side of wafer thinned to 50 μm by a dicing frame and the dicing tape face was set on an adhesive disk by vacuum sucking. One point of the glass plate was lifted by forceps at room temperature, and the glass support was separated. A case where a 50 μm wafer can be separated without crack is evaluated as good, whereas a case where anomalies such as crack have been detected is evaluated as poor.

—Cleaning Removability Test—

After completion of the separation property test, a 200 nm wafer set on the dicing flame with the dicing tape (which had been under the conditions of the heat resistance test) was set to a spin coater so that the adhesive layer faced upward. Isododecane was sprayed as a cleaning solvent for 3 minutes, and isopropyl alcohol (IPA) was sprayed with the wafer being spun to perform rinse. Subsequently, the external appearance of the wafer was inspected visually for the presence of residual adhesive resin. A case where no resin residues have been detected is evaluated as good, whereas a case where resin residues have been detected is evaluated as poor.

—Separation Force Test—

Five polyimide tapes with a length of 150 mm and a width of 25 mm were attached on the silicon wafer after the adhesion and heat resistance tests. The temporary adhesive layer on the portion where the tapes were not attached was removed. The tape was separated from the edge of the tape by 120 mm in 180° separation with AUTOGRAPH (AG-1) manufactured by Shimadzu Corporation. The average force applied at that time (120 mm stroke×5) was regarded as the separation force of the temporary adhesive layer.

TABLE 1

|  | Example 1 | Example 2 | Example 3 | Comparative Example 1 | Comparative Example 2 |
|---|---|---|---|---|---|
| Resin layer (A) | (A-1) | (A-2) | (A-3) | (A-1) | None |
| (A) layer thickness | 6 μm | 4 μm | 5 μm | 7 μm | — |

TABLE 1-continued

| | Example 1 | Example 2 | Example 3 | Comparative Example 1 | Comparative Example 2 |
|---|---|---|---|---|---|
| Resin layer (B) | (B-1) | (B-1) | (B-1) | None | (B-1) |
| (B) layer thickness | 30 μm | 40 μm | 30 μm | — | 50 μm |
| Adhesion temperature | 160° C. | 130° C. | 130° C. | 100° C. | 160° C. |
| Adhesion | good | good | good | good | good |
| Back surface grinding resistance | good | good | good | poor | good |
| Heat resistance | good | good | good | — | good |
| Separation property | good | good | good | — | poor |
| Cleaning removability | good | good | good | — | — |
| Separation force | 40 gf | 20 gf | 10 gf | — | — |

As shown in Table 1, back surface grinding resistance is poor in Comparative Example 1, and separation property is poor in Comparative Example 2. On the other hand, in the temporary adhesive for wafer processing of the present invention, a separation force between a wafer and a support can be controlled with the cleaning property after separation maintained, and a thin wafer can be easily produced. In addition, after the production of the thin wafer, the wafer can be easily separated from the support at room temperature. Therefore, a brittle thin wafer can be easily handled. Therefore, when the amount of resin in a resin modified organopolysiloxane which is a component of a layer (A) is changed, a temporary adhesive layer having any separation force with the cleaning property maintained can be produced.

What is claimed is:

1. A temporary adhesive for wafer processing which temporarily bonds a wafer having a circuit face on the front surface and a processing face on the back surface to a support, comprising a first temporary adhesive layer which is a layer (A) of a thermoplastic resin modified organopolysiloxane obtained by partial dehydration condensation of an organopolysiloxane resin containing a $R^{21}R^{22}R^{23}SiO_{1/2}$ unit, wherein $R^{21}$, $R^{22}$, and $R^{23}$ represent each a substituted or an unsubstituted monovalent hydrocarbon group having 1 to 10 carbon atoms or a hydroxyl group, and a $SiO_{4/2}$ unit in a molar ratio of $R^{21}R^{22}R^{23}SiO_{1/2}$ unit/$SiO_{4/2}$ unit of 0.6 to 1.7 and an organopolysiloxane represented by the following general formula (1), and a second temporary adhesive layer which is a thermosetting modified siloxane polymer layer (B) which is laminated on the first temporary adhesive layer and is releasably bonded to the support,

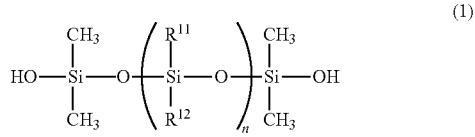

(1)

wherein $R^{11}$ and $R^{12}$ represent each a substituted or an unsubstituted monovalent hydrocarbon group having to 10 carbon atoms and "n" represents 5,000 to 10,000.

2. The temporary adhesive for wafer processing according to claim 1, wherein the ratio of the organopolysiloxane to the organopolysiloxane resin, which are dehydrated and condensed, in the thermoplastic resin modified organopolysiloxane layer (A) is 99:1 to 50:50, and the weight average molecular weight of is 400,000 to 1,500,000.

3. The temporary adhesive for wafer processing according to claim 1, wherein the thermosetting modified siloxane polymer layer (B) is a thermosetting layer of a composition containing 0.1 to 50 parts by mass of one or more kinds selected from an amino condensate modified by formalin or formalin alcohol, a melamine resin, a urea resin, a phenol compound having two or more methylol groups or alkoxymethylol groups on the average per molecule, and an epoxy compound having two or more epoxy groups on the average per molecule, relative to 100 parts by mass of thermosetting modified siloxane polymer including a silphenylene-containing polymer having a repeating unit represented by the following general formula (2) and a weight average molecular weight of 3,000 to 500,000 or an epoxy group-containing silicone polymer having a repeating unit represented by the following general formula (4) and a weight average molecular weight of 3,000 to 500,000,

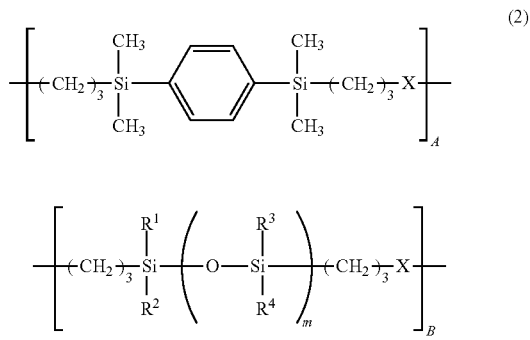

wherein $R^1$ to $R^4$ represent each a monovalent hydrocarbon group having 1 to 8 carbon atoms and may be the same or different; "m" represents an integer of 1 or 100; A represents a positive number; B represents 0 or a positive number; and X represents a divalent organic group represented by the following general formula (3),

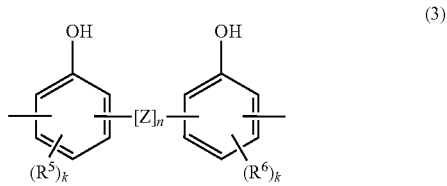

wherein Z represents a divalent organic group selected from

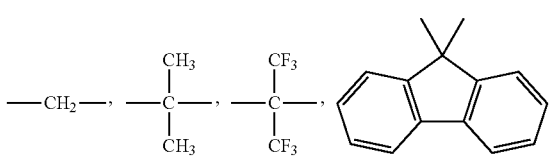

"n" represents 0 or 1; $R^5$ and $R^6$ represent each an alkyl group or an alkoxy group having 1 to 4 carbon atoms and may be the same or different from each other; and "k" represents 0, 1, or 2,

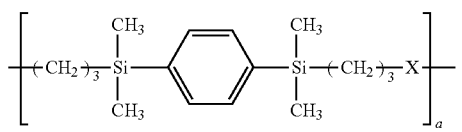
(4)

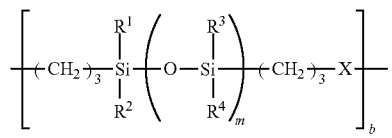

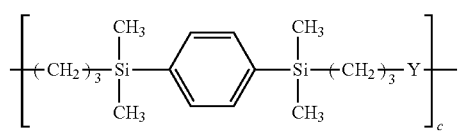

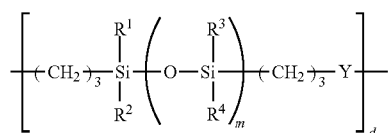

wherein $R^1$ to $R^4$ represent each a monovalent hydrocarbon group having 1 to 8 carbon atoms and may be the same or different; m represents an integer of 1 or 100; "a", "b", "c", and "d" represent each 0 or a positive number, wherein "c" and "d" are not 0 simultaneously and they satisfy 0<(c+d)/(a+b+c+d)≤1.0; X represents a divalent organic group represented by the following general formula (3); and Y represents a divalent organic group represented by the following general formula (5),

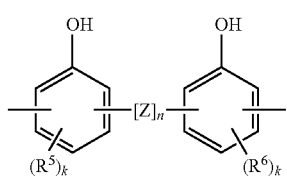
(3)

wherein Z represents a divalent organic group selected from

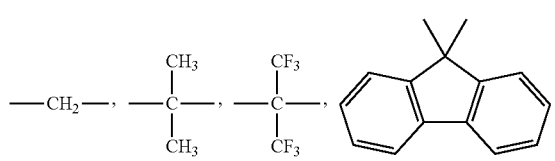

"n" represents 0 or 1; $R^5$ and $R^6$ represent each an alkyl group or an alkoxy group having 1 to 4 carbon atoms and may be the same or different from each other; and "k" represents 0, 1, or 2,

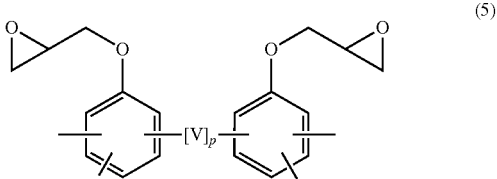
(5)

wherein V represents a divalent organic group selected from

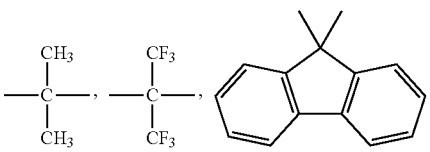

"p" represents 0 or 1; $R^7$ and $R^8$ represent each an alkyl group or an alkoxy group having 1 to 4 carbon atoms and may be the same or different from each other; and "h" represents 0, 1, or 2.

4. The temporary adhesive for wafer processing according to claim 2, wherein the thermosetting modified siloxane polymer layer (B) is a thermosetting layer of a composition containing 0.1 to 50 parts by mass of one or more kinds selected from an amino condensate modified by formalin or formalin alcohol, a melamine resin, a urea resin, a phenol compound having two or more methylol groups or alkoxymethylol groups on the average per molecule, and an epoxy compound having two or more epoxy groups on the average per molecule, relative to 100 parts by mass of thermosetting modified siloxane polymer including a silphenylene-containing polymer having a repeating unit represented by the following general formula (2) and a weight average molecular weight of 3,000 to 500,000 or an epoxy group-containing silicone polymer having a repeating unit represented by the following general formula (4) and a weight average molecular weight of 3,000 to 500,000,

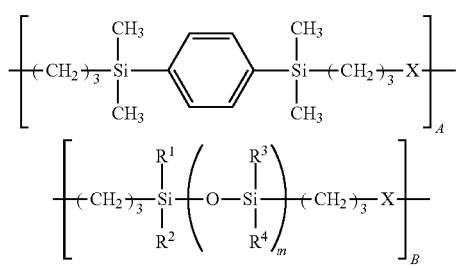
(2)

wherein $R^1$ to $R^4$ represent each a monovalent hydrocarbon group having 1 to 8 carbon atoms and may be the same or different; "m" represents an integer of 1 or 100; A represents a positive number; B represents 0 or a positive number; and X represents a divalent organic group represented by the following general formula (3),

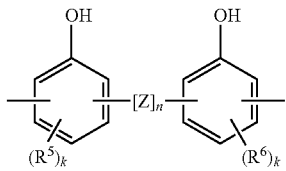
(3)

wherein Z represents a divalent organic group selected from

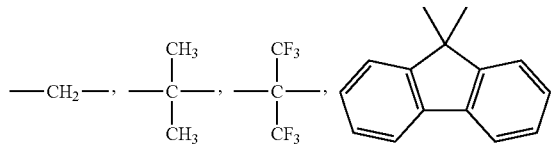

"n" represents 0 or 1; $R^5$ and $R^6$ represent each an alkyl group or an alkoxy group having 1 to 4 carbon atoms and may be the same or different from each other; and "k" represents 0, 1, or 2,

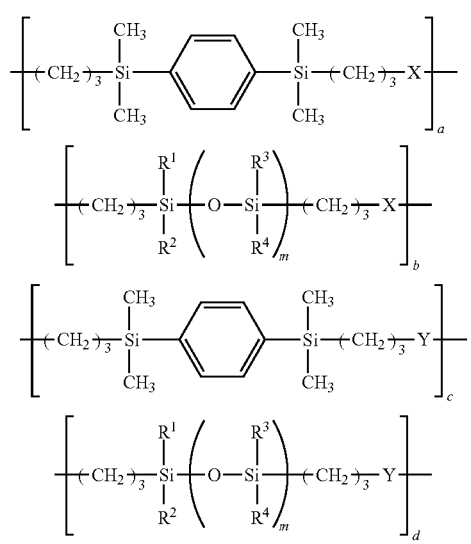
(4)

wherein $R^1$ to $R^4$ represent each a monovalent hydrocarbon group having 1 to 8 carbon atoms and may be the same or different; m represents an integer of 1 or 100; "a", "b", "c", and "d" represent each 0 or a positive number, wherein "c" and "d" are not 0 simultaneously and they satisfy $0<(c+d)/(a+b+c+d)\le 1.0$; X represents a divalent organic group represented by the following general formula (3); and Y represents a divalent organic group represented by the following general formula (5),

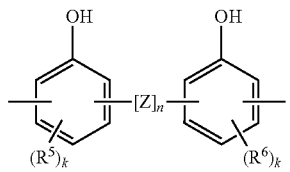
(3)

wherein Z represents a divalent organic group selected from

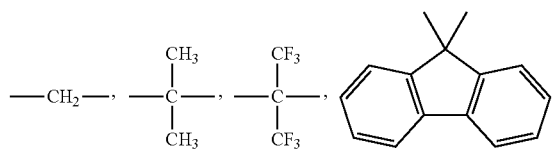

"n" represents 0 or 1; $R^5$ and $R^6$ represent each an alkyl group or an alkoxy group having 1 to 4 carbon atoms and may be the same or different from each other; and "k" represents 0, 1, or 2,

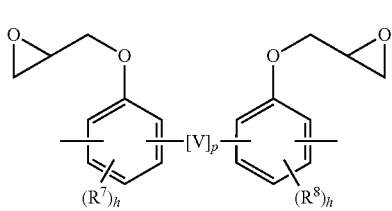
(5)

wherein V represents a divalent organic group selected from

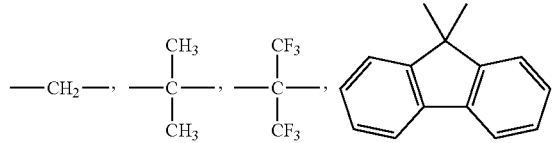

"p" represents 0 or 1; $R^7$ and $R^8$ represent each an alkyl group or an alkoxy group having 1 to 4 carbon atoms and may be the same or different from each other; and "h" represents 0, 1, or 2.

5. A member for wafer processing comprising the temporary adhesive for wafer processing according to claim 1 and a support.

6. A member for wafer processing comprising the temporary adhesive for wafer processing according to claim 2 and a support.

7. A member for wafer processing comprising the temporary adhesive for wafer processing according to claim 3 and a support.

8. A member for wafer processing comprising the temporary adhesive for wafer processing according to claim 4 and a support.

9. A wafer processed body in which the temporary adhesive for wafer processing according to claim 1 is laminated on a support and a wafer having a circuit face on the front surface and a processing face on the back surface is laminated thereon.

10. A wafer processed body in which the temporary adhesive for wafer processing according to claim 2 is laminated on a support and a wafer having a circuit face on the front surface and a processing face on the back surface is laminated thereon.

11. A wafer processed body in which the temporary adhesive for wafer processing according to claim 3 is laminated on a support and a wafer having a circuit face on the front surface and a processing face on the back surface is laminated thereon.

12. A wafer processed body in which the temporary adhesive for wafer processing according to claim 4 is laminated on a support and a wafer having a circuit face on the front surface and a processing face on the back surface is laminated thereon.

13. A method of producing a thin wafer comprising:
(a) bonding a circuit-forming face of a wafer having the circuit-forming face on the front surface and a non-circuit-forming face on the back surface to a support with the temporary adhesive for wafer processing according to claim 1;
(b) grinding or polishing the non-circuit-forming face of the wafer bonded to the support;
(c) processing the non-circuit-forming face of the wafer; and (d) separating the processed wafer from the support.

14. A method of producing a thin wafer comprising:
(a) bonding a circuit-forming face of a wafer having the circuit-forming face on the front surface and a non-circuit-forming face on the back surface to a support with the temporary adhesive for wafer processing according to claim 2;
(b) grinding or polishing the non-circuit-forming face of the wafer bonded to the support;
(c) processing the non-circuit-forming face of the wafer; and (d) separating the processed wafer from the support.

15. A method of producing a thin wafer comprising:
(a) bonding a circuit-forming face of a wafer having the circuit-forming face on the front surface and a non-circuit-forming face on the back surface to a support with the temporary adhesive for wafer processing according to claim 3;
(b) grinding or polishing the non-circuit-forming face of the wafer bonded to the support;
(c) processing the non-circuit-forming face of the wafer; and (d) separating the processed wafer from the support.

16. A method of producing a thin wafer comprising:
(a) bonding a circuit-forming face of a wafer having the circuit-forming face on the front surface and a non-circuit-forming face on the back surface to a support with the temporary adhesive for wafer processing according to claim 4;
(b) grinding or polishing the non-circuit-forming face of the wafer bonded to the support;
(c) processing the non-circuit-forming face of the wafer; and (d) separating the processed wafer from the support.

17. The method for producing a thin wafer according to claim 13, further comprising (e) removing the temporary adhesive layer remaining on the circuit-forming face of the separated wafer after (d) separating the processed wafer from the support.

18. The method for producing a thin wafer according to claim 14, further comprising (e) removing the temporary adhesive layer remaining on the circuit-forming face of the separated wafer after (d) separating the processed wafer from the support.

19. The method for producing a thin wafer according to claim 15, further comprising (e) removing the temporary adhesive layer remaining on the circuit-forming face of the separated wafer after (d) separating the processed wafer from the support.

20. The method for producing a thin wafer according to claim 16, further comprising (e) removing the temporary adhesive layer remaining on the circuit-forming face of the separated wafer after (d) separating the processed wafer from the support.

* * * * *